US011003073B2

(12) United States Patent
Yonezawa et al.

(10) Patent No.: US 11,003,073 B2
(45) Date of Patent: May 11, 2021

(54) PHOTOCURABLE COMPOSITION FOR IMPRINT, METHOD FOR PRODUCING FILM USING THE SAME, METHOD FOR PRODUCING OPTICAL COMPONENT USING THE SAME, METHOD FOR PRODUCING CIRCUIT BOARD USING THE SAME, AND METHOD FOR PRODUCING ELECTRONIC COMPONENT USING THE SAME (71) Applicant: CANON KABUSHIKI KAISHA, Tokyo (JP)

(72) Inventors: Shiori Yonezawa, Tokyo (JP); Toshiki Ito, Kawasaki (JP); Tomonori Otani, Iruma (JP); Kazumi Iwashita, Kobe (JP); Takeshi Honma, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/537,320

(22) PCT Filed: Dec. 15, 2015

(86) PCT No.: PCT/JP2015/006244
§ 371 (c)(1),
(2) Date: Jun. 16, 2017

(87) PCT Pub. No.: WO2016/098345
PCT Pub. Date: Jun. 23, 2016

(65) Prior Publication Data
US 2017/0351172 A1 Dec. 7, 2017

(30) Foreign Application Priority Data

Dec. 19, 2014 (JP) .............................. JP2014-257798
May 14, 2015 (JP) .............................. JP2015-099486
Nov. 28, 2015 (JP) .............................. JP2015-232535

(51) Int. Cl.
*G03F 7/00* (2006.01)
*C08F 2/50* (2006.01)
*G02B 5/18* (2006.01)
*H01L 21/033* (2006.01)
*H01L 21/027* (2006.01)

(52) U.S. Cl.
CPC .............. *G03F 7/0002* (2013.01); *C08F 2/50* (2013.01); *G02B 5/1857* (2013.01); *H01L 21/0337* (2013.01); *H01L 21/0271* (2013.01)

(58) Field of Classification Search
CPC ............... G03F 7/0002; H01L 21/0337; H01L 21/0271; C08F 2/50; G02B 5/1857
See application file for complete search history.

(56) References Cited

U.S. PATENT DOCUMENTS

| 4,323,636 A | 4/1982 | Chen |
| 4,414,278 A | 11/1983 | Cohen |
| 4,423,135 A | 12/1983 | Chen |
| 10,023,673 B2 * | 7/2018 | Kato .................. H01L 21/3081 |
| 10,450,389 B2 * | 10/2019 | Honma ................... C09D 4/00 |
| 10,571,802 B2 * | 2/2020 | Iwashita .................. C08F 2/48 |
| 2007/0065757 A1 | 3/2007 | Ogino |
| 2007/0170617 A1 * | 7/2007 | Choi ..................... B82Y 10/00 264/293 |
| 2010/0009287 A1 * | 1/2010 | Kodama ............... B82Y 10/00 430/270.1 |
| 2011/0182805 A1 | 7/2011 | Desimone |
| 2011/0227239 A1 | 9/2011 | Yamaki |
| 2014/0374884 A1 * | 12/2014 | Kitagawa .............. C08F 220/18 257/618 |

FOREIGN PATENT DOCUMENTS

| CN | 1977221 A | 6/2007 |
| CN | 101116035 A | 1/2008 |
| CN | 101620376 A | 1/2010 |
| CN | 102911052 A | 2/2013 |
| CN | 103113900 A | 5/2013 |
| JP | S51-43374 B | 11/1976 |
| JP | 2007-186570 A | 7/2007 |
| JP | 2010-106062 A | 5/2010 |
| JP | 2011-159881 A | 8/2011 |
| JP | 2012-072269 A | 4/2012 |
| JP | 2012-227190 A | 11/2012 |
| JP | 2013-062489 A | 4/2013 |
| JP | 2013-65813 A | 4/2013 |
| JP | 2013-149884 A | 8/2013 |
| JP | 2013-189537 A | 9/2013 |
| JP | 2013-538239 A | 10/2013 |
| JP | 2014-075577 A | 4/2014 |
| JP | 2014-078697 A | 5/2014 |
| JP | 2014-237632 A | 12/2014 |
| TW | 201038596 A | 11/2010 |
| TW | 201424996 A | 7/2014 |
| TW | 201443000 A | 11/2014 |
| WO | 2010/064534 A1 | 5/2012 |
| WO | 2013/094390 A1 | 6/2013 |
| WO | 2013/162049 A1 | 10/2013 |
| WO | 2014/046304 A1 | 3/2014 |
| WO | 2014/181533 A1 | 11/2014 |
| WO | 2015/030151 A1 | 3/2015 |
| WO | 2015/041154 A1 | 3/2015 |

OTHER PUBLICATIONS

Hiroshima, "Release force reduction in UV nanoimprint mold orientation control and by gas environment", J. Vac. Sci. Technol. B, vol. 27, No. 6, Nov./Dec. 2009, p. 2862-2865).*

(Continued)

*Primary Examiner* — Jessica M Roswell (74) *Attorney, Agent, or Firm* — Canon U.S.A., Inc., IP Division (57) ABSTRACT A photocurable composition for imprint at least has a polymerizable compound (A) and a photopolymerization initiator (B), in which the polymerizable compound (A) contains 20% by weight or more of a multifunctional (meth)acrylic monomer and the glass transition temperature of a photocured substance of the photocurable composition is 90° C. or more.

18 Claims, 1 Drawing Sheet (56) References Cited

OTHER PUBLICATIONS

Aldrich, "Thermal Transitions of Homopolymers: Glass Transitions and Melting Point", p. 52-53 (no date).*
Gokan, H., et al., "Dry Etch Resistance of Organic Materials", J. Electrochem. Soc., Jan. 1983, pp. 143-146, vol. 130, No. 1.
Yu, L. et al., "Photosensitive Cross-linked Block Copolymers with Controllable Release," Photochembiology and Photobiology, vol. 87, No. 3, pp. 646-652. Feb. 10, 2011.

* cited by examiner

FIG. 1A  STEP [1]

FIG. 1B  STEP [2]

FIG. 1C  STEP [3]

FIG. 1D  STEP [4]

FIG. 1E  STEP [5]

FIG. 1F  STEP [6]

FIG. 1G  STEP [7]

PHOTOCURABLE COMPOSITION FOR IMPRINT, METHOD FOR PRODUCING FILM USING THE SAME, METHOD FOR PRODUCING OPTICAL COMPONENT USING THE SAME, METHOD FOR PRODUCING CIRCUIT BOARD USING THE SAME, AND METHOD FOR PRODUCING ELECTRONIC COMPONENT USING THE SAME

CROSS-REFERENCE TO RELATED APPLICATIONS

This application is a National Stage filing of International Application No. PCT/JP2015/006244 filed Dec. 15, 2015, which claims the benefit of Japanese Patent Application No. 2014-257798, filed Dec. 19, 2014, Japanese Patent Application No. 2015 099486, filed May 14, 2015, and Japanese Patent Application No. 2015-232535, filed Nov. 28, 2015, the disclosures of each of which are hereby incorporated by reference herein in their entirety.

TECHNICAL FIELD

The present invention relates to a photocurable composition for imprint, a method for producing a film using the same, a method for producing an optical component using the same, a method for producing a circuit board using the same, and a method for producing an electronic component using the same.

BACKGROUND ART

A demand for miniaturization in semiconductor devices, MEMS, and the like has increased. Therefore, a micromachining technique utilizing a pattern of a resist (photocurable composition for nanoimprint) which is formed on a substrate (wafer) and has a predetermined shape as a mold has recently drawn attention in addition to a former photolithographic technique. This technique is also referred to as an optical imprint (optical nanoimprint) and can form a fine structure of the order of several nanometers on a substrate (PTL 1). According to the optical imprint technique, a resist is first applied to a pattern formation region on a substrate (Arrangement step). Next, this resist is molded using a mold on which a pattern is formed (Mold contact step). Then, light is emitted to cure the resist (Light irradiation step), and then the cured resist is released (Mold release step). By carrying out these steps, the pattern of the resist cured substance (photocured film) having a predetermined shape is formed on the substrate. Furthermore, by repeating all the steps described above at other positions on the substrate, a fine structure can be formed on the entire substrate.

The photocured film having the pattern formed on the substrate by the optical imprint technique is sometimes utilized as a mask in processing a base substrate using a dry etching technique. In this case, in order to process the base substrate with a good yield, the photocured film is required to have high dry etching resistance. Moreover, in manufacturing a semiconductor device, it is required to form a circuit pattern with an accuracy of about ±10 to 12% of a desired line width.

CITATION LIST

Patent Literature

PTL 1: Japanese Patent Laid-Open No. 2007-186570

SUMMARY OF INVENTION

Technical Problem

When transferring the pattern of the resist cured substance to a circuit pattern using the dry etching technique, the resist cured substance thermally expands due to the reaction heat generated in etching. Therefore, when the coefficient of thermal expansion of the resist cured substance is large, expansion and distortion of the pattern line width are caused, which has posed a problem that a circuit pattern with a demanded accuracy is not obtained.

Moreover, when industrially utilizing the optical imprint method, it has been required in order to obtain high productivity that, after bringing a photocurable composition for imprint into contact with a mold, the photocurable composition for imprint is promptly filled into concave portions of a fine pattern on the mold.

In order to solve the above-described problems, a photocurable composition for imprint having small thermal expansion in curing and having excellent filling properties is required.

The present invention provides a photocurable composition for imprint having small thermal expansion in dry etching and having excellent filling properties in an optical imprint method. The present invention also provides a film production method using a photocurable composition for imprint, a method for producing an optical component using the same, a method for producing a circuit board using the same, and a method for producing an electronic component using the same.

Solution to Problem

The present invention is a photocurable composition for imprint at least having a polymerizable compound (A) and a photopolymerization initiator (B), in which the polymerizable compound (A) contains 20% by weight or more of a multifunctional (meth)acrylic monomer and the glass transition temperature of a photocured substance of the photocurable composition is 90° C. or more.

Further features of the present invention will become apparent from the following description of exemplary embodiments with reference to the attached drawings.

DESCRIPTION OF EMBODIMENTS

Hereinafter, an embodiment of the present invention is described in detail with reference to the drawings as appropriate. However, the present invention is not limited to the embodiments described below. In the present invention, those obtained by, for example, altering and modifying as appropriate the embodiments described below without deviating from the scope based on usual knowledges of the persons skilled in the art is included in the scope of the present invention.

Photocurable Composition for Imprint

In this embodiment, a photocurable composition for imprint is a curable composition at least containing a component (A) and a component (B) described below:

Component (A): polymerizable compound; and
Component (B): Photopolymerization initiator.

In particular, the photocurable composition for imprint is suitable for the use of forming a nano-order (1 nm to several hundreds nm) pattern of a photocured film on a base material, such as a semiconductor substrate, which is referred to as nanoimprint. Furthermore, the photocurable composition for imprint is also suitable for the use of dry itching a photocured film formed by the nanoimprint to process the base material.

In this embodiment, the photocured film means a film obtained by polymerizing the photocurable composition on a substrate, and then curing the same. Furthermore, the photocured film may have a pattern shape.

Hereinafter, each component is described in detail.

Component (A): Polymerizable Compound

The component (A) is a polymerizable compound. Herein, in this embodiment, the polymerizable compound is a compound which reacts with a polymerization factor (radical and the like) generated from the photopolymerization initiator (component (B)) to form a film containing a high molecular weight compound by a chain reaction (polymerization reaction).

As such a polymerizable compound, a radical polymerizable compound is mentioned, for example. The polymerizable compound which is the component (A) may contain one kind of a polymerizable compound or may contain two or more kinds of polymerizable compounds.

The radical polymerizable compound is suitably a compound having one or more acryloyl groups or methacryloyl groups, i.e., a (meth)acrylic compound.

Therefore, the component (A) (polymerizable compound) of the photocurable composition for nanoimprint suitably contains a (meth)acrylic compound. The main component of the component (A) is more suitably a (meth)acrylic compound. It is the most suitable for the component (A) to contain only a (meth)acrylic compound. Herein, the fact that the main component of the component (A) is a (meth)acrylic compound means that the component (A) contains 90% by weight or more of a (meth)acrylic compound.

When the radical polymerizable compound contains two or more kinds of compounds having one or more acryloyl groups or methacryloyl groups, the radical polymerizable compound suitably contains a monofunctional (meth)acrylic monomer and a multifunctional (meth)acrylic monomer. This is because, by combining a monofunctional (meth) acrylic monomer and a multifunctional (meth)acrylic monomer, a photocured film having strong mechanical strength is obtained. In this embodiment, the multifunctional (meth) acrylic monomer is suitably contained in a proportion of 25% by weight or more. Thus, it is considered that the crosslink density of the photocured film increases and the thermal expansion in dry etching can be made small.

Examples of monofunctional(meth)acrylic compounds having one acryloyl group or methacryloyl group include, for example, phenoxyethyl(meth)acrylate, phenoxy-2-methylethyl(meth)acrylate, phenoxyethoxyethyl(meth)acrylate, 3-phenoxy-2-hydroxypropyl(meth)acrylate, 2-phenylphenoxyethyl(meth)acrylate, 4-phenylphenoxyethyl(meth)acrylate, 3-(2-phenylphenyl)-2-hydroxypropyl(meth)acrylate, (meth)acrylate of EO-modified p-cumylphenol, 2-bromophenoxyethyl(meth)acrylate, 2,4-dibromophenoxyethyl(meth)acrylate, 2,4,6-tribromophenoxyethyl(meth)acrylate, EO-modified phenoxy(meth)acrylate, PO-modified phenoxy(meth)acrylate, poly-oxyethylene nonylphenyl ether(meth)acrylate, isobornyl(meth)acrylate, 1-adamantyl(meth)acrylate, 2-methyl-2-adamantyl(meth)acrylate, 2-ethyl-2-adamantyl(meth)acrylate, bornyl(meth)acrylate, tricyclodecanyl(meth)acrylate, dicyclopentanyl(meth)acrylate, dicyclopentenyl(meth)acrylate, cyclohexyl(meth)acrylate, 4-butylcyclohexyl(meth)acrylate, acryloyl morpholine, 2-hydroxyethyl(meth)acrylate, 2-hydroxypropyl(meth)acrylate, 2-hydroxybutyl(meth)acrylate, methyl(meth)acrylate, ethyl(meth)acrylate, propyl(meth)acrylate, isopropyl(meth) acrylate, butyl(meth)acrylate, amyl(meth)acrylate, isobutyl (meth)acrylate, t-butyl(meth)acrylate, pentyl(meth)acrylate, isoamyl(meth)acrylate, hexyl(meth)acrylate, heptyl(meth) acrylate, octyl(meth)acrylate, isooctyl(meth)acrylate, 2-ethylhexyl(meth)acrylate, nonyl(meth)acrylate, decyl(meth) acrylate, isodecyl(meth)acrylate, undecyl(meth)acrylate, dodecyl(meth)acrylate, lauryl(meth)acrylate, stearyl(meth) acrylate, isostearyl(meth)acrylate, benzyl(meth)acrylate, 1-naphthylmethyl(meth)acrylate, 2-naphthylmethyl(meth) acrylate, tetrahydrofurfuryl(meth)acrylate, butoxyethyl (meth)acrylate, ethoxy diethylene glycol(meth)acrylate, polyethylene glycol mono(meth)acrylate, polypropylene glycol mono(meth)acrylate, methoxyethylene glycol(meth) acrylate, ethoxyethyl(meth)acrylate, methoxy polyethylene glycol(meth)acrylate, methoxy polypropylene glycol(meth) acrylate, diacetone(meth)acryl amide, isobutoxy methyl (meth)acryl amide. N,N-dimethyl(meth)acryl amide, t-octyl (meth)acryl amide, dimethylaminoethyl(meth)acrylate, diethylaminoethyl(meth)acrylate, 7-amino-3,7-dimethyl octyl(meth)acrylate, N,N-diethyl(meth)acryl amide, N,N-dimethyl aminopropyl(meth)acryl amide, and the like but the monofunctional(meth)acrylic compounds having one acryloyl group or methacryloyl group are not limited thereto.

Examples of commercially-available items of the monofunctional(meth)acrylic compound include Aronix M101, M102, M110, M111, M113, M117, M5700, TO-1317, M120. M150, and M156 (all manufactured by Toagosei Co., Ltd.), MEDOL10, MIBDOL10, CHDOL10, MMDOL30, MEDOL30, MIBDOL30, CHDOL30, LA, IBXA, 2-MTA, HPA, Viscoat #150, #155, #158, #190, #192, #193, #220, #2000, #2100, and #2150 (all manufactured by Osaka Organic Chemical Industry Co., Ltd.), Light acrylate BO-A, EC-A, DMP-A, THF-A, HOP-A, HOA-MPE, HOA-MPL, PO-A, P-200A, NP-4EA, NP-8EA, and Epoxyester M-600A (all manufactured by Kyoeisha Chemical Co., Ltd.), KAYARAD TC110S, R-564, and R-128H (all manufactured by Nippon Kayaku Co., Ltd.), NK ester AMP-10G and AMP-20G (all manufactured by Shin-Nakamura Chemical), FA-511A, 512A, and 513A (all manufactured by Hitachi Chemical Co., Ltd.), PHE. CEA, PHE-2, PHE-4, BR-31, BR-31M, and BR-32 (all manufactured by Daiichi Kogyo Seiyaku Co., Ltd.), VP (manufactured by BASF), ACMO, DMAA, and DMAPAA (all manufactured by KOHJIN Film & Chemicals Co., Ltd.), and the like but the commercially-available items of the mono-functional(meth)acrylic compound are not limited thereto.

Examples of multifunctional (meth)acrylic compounds having two or more acryloyl groups or methacryloyl groups include, for example, trimethylol propane di(meth)acrylate, trimethylol propane tri(meth)acrylate, EO-modified trimethylol propane tri(meth)acrylate, PO-modified trimethylol propane tri(meth)acrylate, EO,PO-modified trimethylol propane tri(meth)acrylate, dimethylol tricyclodecane di(meth)acrylate, pentaerythritol tri(meth)acrylate, pentaerythritol tetra(meth)acrylate, ethylene glycol di(meth)acrylate, tetraethylene glycol di(meth)acrylate, phenyl ethylene glycol di(meth)acrylate, 2-phenyl-1,3-propanediol diacrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, 1,9-nonanediol di(meth)acrylate, 1,10-decanediol di(meth)acrylate, 1,3-adamantane dimethanol di(meth)acrylate, o-xylylene di(meth)acrylate, m-xylylene di(meth)acrylate, p-xylylene di(meth)acrylate, tris(2-hydosyethyl)isocyanurate tri(meth)acrylate, tris(acryloyloxy)isocyanurate, bis (hydroxymethyl)tricyclodecane di(meth)acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, EO,PO-modified 2,2-bis(4-((meth)acryloxy)phenyl)propane, and the like are mentioned but the multifunctional (meth)acrylic compounds having two or more acryloyl groups or methacryloyl groups are not limited thereto.

Examples of commercially-available items of the multifunctional (meth)acrylic compound include Yupimer UV SA1002 and SA2007 (all manufactured by Mitsubishi Chemical Corporation), Viscoat #195, #230, #215, #260, #335HP. #295, #300, #360, #700, GPT, and 3PA (all manufactured by Osaka Organic Chemical Industry Co., Ltd.), Light acrylate 4EG-A, 9EG-A, NP-A, DCP-A, BP-4EA, BP-4PA, TMP-A, PE-3A, PE-4A, and DPE-6A (all manufactured by a Kyoeisha Chemical Co., Ltd.), KAYARAD PET-30, TMPTA, R-604, DPHA, DPCA-20, -30, -60, -120, HX-620, D-310, and D-330 (all manufactured by Nippon Kayaku Co., Ltd.), Aronix M208, M210, M215, M220, M240, M305, M309, M310, M315, M325, and M400 (all manufactured by Toagosei Co., Ltd.), Ripoxy VR-77, VR-60, and VR-90 (all manufactured by Showa Denko), and the like are mentioned but the commercially-available items are not limited thereto.

In the compound groups mentioned above, the (meth)acrylate refers to acrylate or methacrylate having an alcohol residue equivalent thereto. The (meth)acryloyl group refers to an acryloyl group or a methacryloyl group having an alcohol residue equivalent thereto. The EO refers to ethylene oxide. The EO-modified compound A refers to a compound in which a (meth)acrylic acid residue and an alcohol residue of the compound A are bonded to each other through the block structure of an ethylene oxide group. The PO refers to propylene oxide. The PO-modified compound B refers to a compound in which a (meth)acrylic acid residue and an alcohol residue of the compound B are bonded to each other through the block structure of a propylene oxide group.

Ohnishi Parameter of Component (A)

It is known that the dry etching speed V of a composition, the total number of atoms N in a composition, the total number of carbon atoms NC in a composition, and the total number of oxygen atoms NO in a composition have the following relationship shown in the following expression (1) (J. Electrochem. Soc., 130, p 143 (1983)).

$$V \propto N/(N_C - N_O) \quad (1)$$

In Expression (1), $N/(N_C - N_O)$ is commonly referred to as a "Ohnishi parameter". For example, PTL 1 describes a technique of obtaining a photocurable composition having high dry etching resistance by the use of a polymerizable compound component having a small Ohnishi parameter.

According to Expression (1) above, it is suggested that organic compounds having a smaller number of oxygen atoms or having a larger number of aromatic ring structures or alicyclic structures have smaller Ohnishi parameters and have high dry etching resistance.

When the component (A) contains two or more kinds of polymerizable compounds, the Ohnishi parameter is calculated using the following expression (2) as the mole fraction weighted average value.

$$OP = n_1 OP_1 + n_2 OP_2 + \ldots + n_n OP_n \quad (2)$$

In this embodiment, the Ohnishi parameter of the component (A) is suitably 3.2 or less. When the component (A) is configured by a polymerizable compound in which the Ohnishi parameter is smaller than 3.2, good dry etching resistance is obtained. On the other hand, when the component (A) is configured by a polymerizable compound in which the Ohnishi parameter is larger than 3.2, the dry etching resistance is low, and therefore, a desired substrate processing accuracy cannot be obtained in some cases, which may lead to a reduction in yield.

Component (B): Photopolymerization initiator

The component (B) is a photopolymerization initiator.

In this embodiment, the photopolymerization initiator is a compound which detects light of a predetermined wavelength to cause generation of the polymerization factor (radical). Specifically, the photopolymerization initiator is a polymerization initiator (radical venerating agent) which generates a radical by light (radiation rays, such as infrared rays, visible rays, ultraviolet rays, far ultraviolet rays, X-rays, and charged particle beams, such as electron beams).

The component (B) may be configured from one kind of photopolymerization initiator or may be configured from two or more kinds of photopolymerization initiators.

Examples of the radical generating agents include, for example, 2,4,5-triaryl imidazole dimers which may have substituents, such as a 2-(o-chlorophenyl)-4,5-diphenyl imidazole dimer, a 2-(o-chlorophenyl)-4,5-di(methoxyphenyl) imidazole dinner, a 2-(o-fluorophenyl)-4,5-diphenyl imidazole dimer, and a 2-(o- or p-methoxyphenyl)-4,5-diphenyl imidazole dimer; Benzophenone derivatives, such as benzophenone, N,N'-tetramethyl-4,4'-diaminobenzophenone (Michler's Ketone), N,N'-tetraethyl-4,4'-diaminobenzophenone, 4-methoxy-4'-dimethylaminobenzophenone, 4-chlorobenzophenone, 4,4'-dimethoxy benzophenone, and 4,4'-diaminobenzophenone; α-amino aromatic ketone derivatives, such as 2-benzyl-2-dimethylamino-1-(4-morpholinophenyl)-butanone-1,2-methyl-1-[4-(methyl thio) phenyl]-2-morpholino-propane-1-on; quinones, such as 2-ethyl anthraquinone, phenanthrene quinone, 2-t-butyl anthraquinone, octamethyl anthraquinone, 1,2-benz anthraquinone, 2,3-benz anthraquinone, 2-phenyl anthraquinone, 2,3-diphenyl anthraquinone, 1-chloroanthraquinone, 2-methyl anthraquinone, 1,4-naphthoquinone, 9,10-phenanthraquinone, 2-methyl-1,4-naphthoquinone, and 2,3-dimethyl anthraquinone; benzoin ether derivatives, such as benzoin methyl ether, benzoin ethyl ether, and benzoin phenyl ether; benzoin derivatives, such as benzoin, methyl benzoin, ethyl benzoin, and propyl benzoin; benzyl derivatives, such as benzyl dimethyl ketal; acridine derivatives, such as 9-phenyl acridine and 1,7-bis(9,9'-acridinyl)heptane; N-phenylglycine derivatives, such as N-phenylglycine; acetophenone derivatives, such as acetophenone, 3-methyl acetophenone, acetophenone benzyl ketal, 1-hydroxy cyclohexyl phenyl ketone, and 2,2-dimethoxy-2-phenyl acetophenone; thioxanthone derivatives, such as thioxanthone, diethyl thioxanthone, 2-isopropyl thioxanthone, and 2-chlorothioxanthone; acyl phosphine oxide derivatives, such as 2,4,6-trimethyl benzoyl diphenyl phosphine oxide, bis(2,4,6-trimethyl benzoyl)phenyl phosphine oxide, and bis-(2,6-dimethoxy benzoyl)-2,4,4-trimethyl pentyl phosphine oxide; oxime ester derivatives, such as 1,2-octanedione, 1-[4-(phenylthio)-,2-(O-benzoyloxime)], ethanone, 1-[9-ethyl-6-(2-methyl benzoyl)-9H-carbazole-3-yl]-, and 1-(o-acetyl oxime); xanthone, fluorenone, benzaldehyde, fluorene, anthraquinone, triphenyl carbazole, 1-(4-isopropylphenyl)-2-hydroxy-2-methylpropane-1-on, 2-hydroxy-2-methyl-1-phenyl propane 1-on, and the like but the radical generating agents are not limited thereto.

Examples of commercially-available items of the radical generating agent include Irgacure184, 369, 651, 500, 819, 907, 784, 2959, CGI-1.700, -1750, -1850, and CG24-61, Darocur 1116 and 1173, Lucirin TPO, LR8893, and L12.8970 (all manufactured by BASF), Uvecryl P36 (manufactured by UCB), and the like but the commercially-available items are not limited thereto.

Among the above, the component (B) of the photocurable composition for nanoimprint is suitably an acylphosphine oxide polymerization initiator.

Among the examples above, the acyl phosphine oxide polymerization initiator is an acyl phosphine oxide compound, such as 2,4,6-trimethyl benzoyl diphenyl phosphine oxide, bis(2,4,6-trimethyl-benzoyl)phenyl phosphine oxide, or bis(2,6-dimethoxy benzoyl)-2,4,4-trimethyl pentyl phosphine oxide.

The compounding ratio of the component (B) which is a photopolymerization initiator in the photocurable composition for nanoimprint is suitably 0.01% by weight or more and 10% by weight or less and more suitably 0.1% by weight or more and 7% by weight or less based on the total amount of the component (A) which is a polymerizable compound.

By setting the compounding ratio of the component (B) to 0.01% by weight or more based on the total amount of the polymerizable compound, the curing rate of a composition increases and the reaction efficiency can be improved. By setting the compounding ratio of the component (B) to 10% by weight or less based on the total amount of the polymerizable compound, the photocured film to be obtained is a photocured film having a certain degree of mechanical strength.

Other Additive Components (C)

The photocurable composition for nanoimprint of this embodiment may contain further additive components (C) in addition to the component (A) and the component (B) described above according to various purposes insofar as the effects of the present invention are not impaired. Examples of such additive components (C) include a sensitizer, a hydrogen donor, an internal mold release agent, a surfactant, an antioxidant, a solvent, a polymer component, and a polymerization initiator which is not the component (B), and the like.

The sensitizer is a compound to be added as appropriate for the purpose of promoting the polymerization reaction and improving the reaction conversion rate. As the sensitizer, a sensitizing dye and the like are mentioned, for example.

The sensitizing dye is a compound which is excited by absorbing light of a specific wavelength and interacts with the photopolymerization initiator which is the component (B). The interaction described herein is energy transfer, electron transfer, and the like from the sensitizing dye in the excited state to the photopolymerization initiator which is the component (B).

Specific examples of the sensitizing dye include an anthracene derivative, an anthraquinone derivative, a pyrene derivative, a perylene derivative, a carbazole derivative, a benzophenone derivative, a thioxanthone derivative, a xanthone derivative, a coumarin derivative, a phenothiazine derivative, a camphorquinone derivative, an acridine dye, a thiopyrylium salt dye, a merocyanine dye, a quinoline dye, a styryl quinoline dye, a ketocoumarin dye, a thioxanthene dye, a xanthene dye, an oxonol dye, a cyanine dye, a rhodamine dye, a pyrylium salt dye, and the like but the sensitizing dye is not limited thereto.

The sensitizers may be used alone or as a mixture of two or more kinds thereof.

The hydrogen donor is a compound which reacts with an initiation radical generated from the photopolymerization initiator which is the component (B) or a radical at the polymerization growth terminal to generate a radical having higher reactivity. It is suitable to add the hydrogen donor when the photopolymerization initiator which is the component (B) is a photoradical generating agent.

Specific examples of such a hydrogen donor include amine compounds, such as n-butyl amine, di-n-butyl amine, tri-n-butyl phosphine, allylthio urea, s-benzyl isothiuronium-p-toluene sulfinate, triethyl amine, diethyl amino ethyl methacrylate, triethylene tetramine, 4,4'-bis(dialkyl amino) benzophenone, N,N-dimethylamino benzoic acid ethyl ester, N,N-dimethylamino benzoic acid isoamyl ester, pentyl-4-dimethylamino benzoate, triethanol amine, and N-phenylglycine, mercapto compounds, such as 2-mercapto-N-phenyl benzimidazole and mercaptopropionic acid ester, and the like but the hydrogen donor is not limited thereto.

The hydrogen donors may be used alone or as a mixture of two or more kinds thereof.

The hydrogen donor may have a function as a sensitizer.

When the photocurable composition for nanoimprint of this embodiment contains the sensitizer or the hydrogen donor as the additive component (C), the content of each of the sensitizer and the hydrogen donor is suitably 0.1% by weight or more and 20% by weight or less, more suitably 0.1% by weight or more and 5.0% by weight or less, and still more suitably 0.2% by weight or more and 2.0% by weight or less based on the total amount of the component (A) which is the polymerizable compound. When the sensitizer is contained in a proportion of 0.11 by weight or more based on the total amount of the component (A), the polymerization promotion effect can be more effectively demonstrated. By setting the content of the sensitizer or the hydrogen donor to 5.0% by weight or less, the molecular weight of a high molecular weight compound configuring a photocured film to be produced becomes sufficiently high and also poor dissolution in the photocurable composition for nanoimprint or degradation of the storage stability of the photocurable composition for nanoimprint can be suppressed.

For the purpose of reducing the interface bonding force between a mold and a resist, i.e., a reduction in mold releasing force in a mold release step, an internal mold release agent can be added to the photocurable composition for nanoimprint. In this specification, the internal type means that the mold release agent is added to a curable composition in advance before an arrangement step of the photocurable composition for nanoimprint.

As the internal mold release agent, surfactants, such as a silicone based surfactant, a fluorine based surfactant, and a hydrocarbon based surfactant, and the like can be used. In this embodiment, the internal mold release agent does not have polymerizability.

The fluorine based surfactant includes polyalkylene oxide (polyethylene oxide, polypropylene oxide, and the like) adducts of alcohols having a perfluoro alkyl group), polyalkylene oxides (polyethylene oxide, polypropylene oxide, and the like) adducts of perfluoro polyether, and the like. The fluorine based surfactant may have a hydroxyl group, an alkoxy group, an alkyl group, an amino group, a thiol group, and the like in a part of the molecular structure (for example, terminal group).

As the fluorine based surfactant, commercially-available items may be used. Examples of the commercially-available items include, for example, Megafac F-444, TF-2066, TF-2067, and TF-2068 (all manufactured by DIC), Fluorad FC-430 and FC-431 (all manufactured by Sumitomo 3M Limited), Surflon S-382 (manufactured by AGC), EFTOP EF-122A, 12213, 122C, EF-121, EF-126, EF-127, and MF-100 (all manufactured by Tokem Products Co., Ltd.), PF-636, PF-6320, PE-656, and PF-6520 (all manufactured by OMNOVA Solutions), Unidyne DS-401, DS-403, and DS-451 (all manufactured by Daikin Industries), Ftergent 250, 251, 222F, and 208G (all manufactured by NEOS Co. Ltd.), and the like.

The internal mold release agent may be a hydrocarbon based surfactant.

The hydrocarbon based surfactant includes alkylalcohol polyalkylene oxide adducts obtained by adding alkylene oxide having 2 to 4 carbon atoms to alkyl alcohols having 1 to 50 carbon atoms and the like.

Examples of the alkylalcohol polyalkylene oxide adducts include a methyl alcohol ethylene oxide adduct, a decyl alcohol ethylene oxide adduct, a lauryl alcohol ethylene oxide adduct, a cetyl alcohol ethylene oxide adduct, a stearyl alcohol ethylene oxide adduct, a stearyl alcohol ethylene oxide/propylene oxide adduct, and the like. The terminal group of the alkylalcohol polyalkylene oxide adduct is not limited to a hydroxyl group which can be produced by simply adding polyalkylene oxide to alkyl alcohol. The hydroxyl group may be converted to other substituents, e.g., polar functional groups, such as a carboxyl group, an amino group, a pyridyl group, a thiol group, and a silanol group, and hydrophobic functional groups, such as an alkyl group and an alkoxy group.

As the alkylalcohol polyalkylene oxide adduct, commercially-available items may be used. Examples of the commercially-available items include for example, polyoxy ethylene methyl ether (methyl alcohol ethylene oxide adduct) (BLAUNON MP-400, MP-550, and MP-1000) manufactured by AOKI OIL INDUSTRIAL Co., LTD., polyoxy ethylene decyl ether (decyl alcohol ethylene oxide adduct) (FINESURF D-1303, D-1305, D-1307, and D-1310) manufactured by AOKI OIL INDUSTRIAL Co., LTD., polyoxy ethylene lauryl ether (lauryl alcohol ethylene oxide adduct) (BLAUNON EL-1505) manufactured by AOKI OIL INDUSTRIAL Co., LTD., polyoxy ethylene cetyl ether (cetyl alcohol ethylene oxide adduct) (BLAUNON CH-305 and CH-310) manufactured by AOKI OIL INDUSTRIAL Co., LTD., polyoxy ethylene stearyl ether (stearyl alcohol ethylene oxide adduct) (BLAUNON SR-705, SR-707, SR-715, SR-720, SR-730, and SR-750) manufactured by AOKI OIL INDUSTRIAL Co., LTD., random polymerization type polyoxy ethylene polyoxypropylene stearyl ether (BLAUNON SA-50/50 1000R and SA-30/70 2000R) manufactured by AOKI OIL INDUSTRIAL Co., LTD., polyoxy ethylene methyl ether (Pluriol A760E) manufactured by BASF, polyoxy ethylene alkyl ether manufactured by Kao Corporation (EMULGEN series), and the like.

Among the hydrocarbon based surfactants, the internal mold release agent is suitably an alkylalcohol polyalkylene oxide adduct and more suitably a long chain alkylalcohol polyalkylene oxide adduct.

The internal mold release agents may be used alone or as a mixture of two or more kinds thereof.

When the photocurable composition for nanoimprint of this embodiment contains the internal mold release agent as the additive component (C), the content of the internal mold release agent is 0.001% by weight or more and 10% by weight or less based on the total amount of the component (A) which is the polymerizable compound. The content is suitably 0.01% by weight or more and 7% by weight or less and more suitably 0.05% by weight or more and 5% by weight or less.

By analyzing the photocurable composition for nanoimprint of this embodiment and/or a photocured film obtained by curing the same by infrared spectroscopy, ultraviolet-visible spectroscopy, Pyrolysis-Gas Chromatography/Mass spectrometry, or the like, the proportions of the component (A) and the component (B) can be determined, and consequently the proportions of the component (A) and the component (B) in the photocurable composition for imprint can be determined. Also when the additive component (C) is contained, the proportions of the component (A), the component (B), and the additive component (Q in the photocurable composition for imprint can be similarly determined.

Glass Transition Temperature of Photocurable Composition for Imprint

The glass transition temperature of a photocured substance of the photocurable composition for imprint of this embodiment is suitably 90° C. or more and more suitably 120° C. or more. It is considered that, by setting the glass transition temperature to 90° C. or more, thermal expansion and thermal distortion in dry etching are hard to occur.

As a method for measuring the glass transition temperature of the photocured substance, the glass transition temperature can be measured using differential scanning calorimeter (DSC) or a dynamic viscoelasticity device.

For example, when the glass transition temperature is measured using DSC, the extrapolation glass transition initiating temperature (Tig) is determined from the intersection of the straight line obtained by extending the baseline (DSC curve portion in a temperature region where transition and a reaction does not occur in a test piece) on the low temperature side of the DSC curve of the photocured substance to the high temperature side and the tangent drawn in such a manner that the gradient of the curve of a step-like change portion of the glass transition reaches the maximum, and then the extrapolation glass transition start temperature (Tig) can be determined as the glass transition temperature. As a main device, STA-6000 (manufactured by Perkin Eimer) and the like are mentioned.

On the other hand, when the transition temperature is measured using a dynamic viscoelasticity device, the temperature at which the loss tangent (tan δ) of the photocured substance reaches the maximum is defined as the glass transition temperature. As a main device capable of measuring the dynamic viscoelasticity, MCR301 (manufactured by Anton Paar) and the like are mentioned.

In the present invention, it may be able to be confirmed that the glass transition temperature is 90° C. or more by any one of the measuring methods described above. A photocurable composition having a glass transition temperature of 90° C. or more in the measurement of the loss tangent using a dynamic viscoelasticity device is suitable. The dynamic viscoelasticity device can consistently perform the production of the photocured substance and the measurement of the glass transition temperature and further the measurement of the coefficient of thermal expansion described later.

Depending on the composition of the photocurable composition, due to the fact that a photopolymerization initiator having high absorption in the exposure wavelength (for example, around 365 nm) to be used in the dynamic viscoelasticity device is contained, the transmittance to a 0.1 μm thick photocured film decreases, so that the glass transition temperature cannot be measured with good accuracy in some cases. Specifically, the measurement becomes difficult when the transmittance is 30% or less.

In this case, it can be confirmed by the following method that the photocurable composition for imprint has a glass transition temperature of 90° C. or more.

3 parts by weight of Lucirin TPO which is a photopolymerization initiator (B) having low influence on a reduction in transmittance based on 100 parts by weight of the photopolymerizable compound (A) to be used is compounded to produce a photocurable composition, and then the loss tangent tan δ of a photocured film is measured while increasing the temperature. Then, due to the fact that the temperature at which the tan δ reaches the maximum is 90° C. or more, it can be specified that the glass transition temperature of the photocurable composition is 90° C. or more.

The composition of the photopolymerizable compound (A) is the main factor of determining the glass transition temperature. The influence of the photopolymerization initiator of a small content on the glass transition temperature of the photocurable composition (B) is low. Therefore, it can be specified by carrying out the measuring method described above that the glass transition temperature of the photocurable composition is 90° C. or more.

Temperature in Compounding Photocurable Composition for Imprint

When preparing the photocurable composition for imprint of this embodiment, at least the component (A) and the component (B) are mixed and dissolved under predetermined temperature conditions. Specifically, the mixing and the dissolution are carried out in the range of 0° C. or more and 100° C. or less. The same applies to the case where the additive component (C) is contained.

Viscosity of Photocurable Composition for Imprint

The viscosity at 23° C. of a mixture of the components except a solvent of the photocurable composition for imprint of this embodiment is suitably 1 mPa*s or more and 100 mPa*s or less, more suitably 3 mPa*s or more and 50 mPa*s or less, and still more suitably 5 mPa*s or more and 12 mPa*s or less.

By setting the viscosity of the photocurable composition for imprint to 100 mPa*s or less, when the photocurable composition for imprint is brought into contact with a mold, the time required for the composition to fill into concave portions of a fine pattern on the mold is not prolonged. More specifically, the optical imprint method can be carried out with high productivity. Moreover, pattern defects due to poor filling are hard to occur.

By setting the viscosity to 1 mPa*s or more, when the photocurable composition for imprint is applied onto a substrate, application unevenness is hard to occur and, when the photocurable composition for imprint is brought into contact with a mold, the photocurable composition for imprint is difficult to flow out of end portions of the mold.

Surface Tension of Photocurable Composition for Imprint

With respect to the surface tension of the photocurable composition for imprint of this embodiment, the surface tension at 23° C. of the mixture of the components except a solvent is suitably 5 mN/m or more and 70 mN/m or less, more suitably 7 mN/m or more and 35 mN/m or less, and still more suitably 10 mN/m or more and 32 mN/m or less. Herein, by setting the surface tension to 5 mN/m or more, when the photocurable composition for imprint is brought into contact with a mold, the time required for the composition to fill into concave portions of a fine pattern on the mold is not prolonged.

By setting the surface tension to 70 mN/m or less, a photocured film obtained by curing the photocurable composition for imprint is a photocured film having surface smoothness.

Impurities Mixed in Photocurable Composition for Imprint

It is suitable for the photocurable composition for imprint of this embodiment not to contain impurities as much as possible. The impurities described herein mean substances other than the component (A), the component (B), and the additive component (C) described above.

Therefore, the photocurable composition for imprint is suitably one obtained passing through a purification step. As such a purification step, filtration using a filter or the like are suitable.

Specifically, when performing the filtration using a filter, it is suitable that the component (A), the component (B), and the additive component to be added as necessary described above are mixed, and then the mixture is filtered with a filter having a pore size of 0.001 μm or more and 5.0 μm or less. When performing the filtration using a filter, it is more suitable to perform the filtration in many stages or to repeat the filtration many times. The filtered liquid may be filtered again. A plurality of filters having different pore sizes may be used. As the filter for use in the filtration, filters formed of polyethylene resin, polypropylene resin, fluororesin, nylon resin, and the like can be used but the filter is not particularly limited thereto.

By passing through such a purification step, impurities, such as particles, mixed in the photocurable composition for imprint, can be removed. Thus, pattern defects caused by irregularities accidentally formed in a photocured film, which is obtained after curing the photocurable composition for imprint, due to the impurities, such as particles, can be prevented.

When the photocurable composition for imprint of this embodiment is used for manufacturing a semiconductor integrated circuit, it is suitable to avoid the mixing of impurities (metal impurities) containing metal atoms into the photocurable composition for imprint as much as possible in order not to inhibit an operation of a product. In such a case, the concentration of the metal impurities contained in the photocurable composition for imprint is adjusted to suitably 10 ppm or less and more suitably 100 ppb or less.

As described above, the present invention can take various aspects but suitably takes an aspect containing at least either the following item (A) or (B):

(A) The polymerizable compound (A) at least contains 40% by weight or more of a multifunctional (meth)acrylic monomer and the glass transition temperature of a photocured substance of a photocurable composition is 120° C., or more; or (B) The multifunctional acrylic monomer contained in the polymerizable compound (A) is any one of m-xylylene diacrylate, phenyl ethylene glycol diacrylate, and 2-phenyl-1,3-propanediol diacrylate.

Method for Producing Film Having Pattern Shape

Next, a method for producing a film having a pattern shape of this embodiment is described. FIGS. 1A to 1G are schematic cross sectional views illustrating an example of the method for producing a film having a pattern shape of this embodiment.

The method for producing a film having a pattern shape of this embodiment has:

[1] an arrangement step of arranging the photocurable composition for imprint of the embodiment described above on a substrate;

[2] a mold contact step of bringing the photocurable composition for imprint into contact with a mold;

[3] an alignment step of aligning the positions of the mold and a substrate to be processed;

[4] a light irradiation step of irradiating the photocurable composition for imprint with light; and

[5] a releasing step of releasing the photocured film obtained by the step [4] and the mold from each other.

The method for producing a photocured film having a pattern shape of this embodiment is a method for producing a film utilizing the optical imprint method.

The photocured film obtained by the method for producing a photocured film having a pattern shape of this embodiment is suitably a film having a pattern of a size 1 nm or more and 10 mm or less and more suitably a film having a pattern of a size of 10 nm or more and 100 µm or less. In general, a pattern formation technique of producing a film having a pattern (irregular structure) of a nano size (1 nm or more 100 nm or less) utilizing light is referred to as an optical nanoimprint method. The method for producing a photocured film having a pattern shape of this embodiment employs the optical nanoimprint method.

Hereinafter, each step is described.

[Arrangement Step [1]]

Figure 1A:
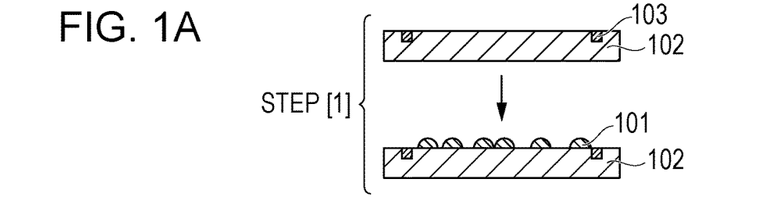
FIG. 1A is a schematic cross sectional view illustrating an example of a method for producing a film of this embodiment.

In this step (arrangement step), a photocurable composition for imprint 101 of this embodiment described above is arranged (applied) on a substrate 102 to form a coating film as illustrated in FIG. 1A.

The substrate 102 which is a target on which the photocurable composition for imprint 101 is to be arranged is a substrate to be processed and a silicon wafer is usually used.

In this embodiment, however, the substrate 102 is not limited to the silicon wafer and may be arbitrarily selected from those known as substrates for semiconductor devices, such as aluminum, a titanium-tungsten alloy, an aluminum-silicon alloy, an aluminum-copper-silicon alloy, silicon oxide, silicon nitride, and the like for use. For the substrate 102 to be used (substrate to be processed), a substrate whose adhesiveness with the photocurable composition for imprint is improved by surface treatment, such as silane coupling treatment, silazane treatment, and film formation of an organic thin film.

In this embodiment, as a method for arranging the photocurable composition for imprint on the substrate to be processed, for example, an ink jet method, a dip coating method, an air knife coating method, a curtain coating method, a wire bar coating method, a gravure coating method, an extrusion coating method, a spin coating method, a slit scan method, and the like can be used. In the optical imprint method, the ink jet method is particularly suitable. The film thickness of a layer to which a shape is to be transferred (coating film) varies depending on the intended use and is 0.01 µm or more and 100.0 µm or less, for example.

[Mold Contact Step [2]]

Figure 1B:
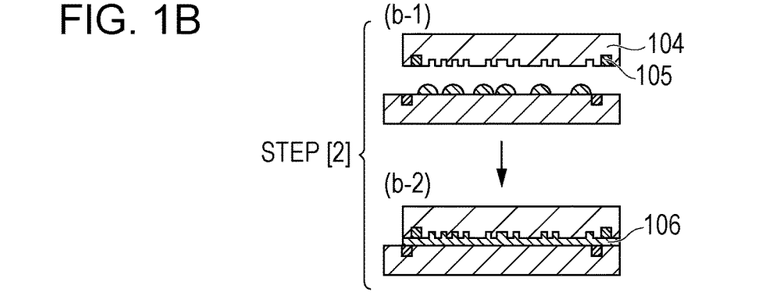
FIG. 1B includes FIGS. 1B(b-1) and 1B(b-2) illustrating schematic cross sectional views illustrating the example of a method for producing a film of this embodiment.

Next, as illustrated in FIGS. 1B(b-1) and 1B(b-2), a mold 104 having an original pattern for transferring a pattern shape is brought into contact with the coating film containing the photocurable composition for imprint 101 formed in the previous step (arrangement step). By bringing the mold 104 into contact with the photocurable composition 101 for imprint (layer to which a shape is to be transferred) in this step (FIG. 1B(b-1)), the coating film (partially) containing the photocurable composition for imprint 101 is filled into concave portions of a fine pattern on the surface of the mold 104, so that a coating film 106 filled into the fine pattern of the mold is obtained (FIG. 1B(b-2)).

The mold 104 is required to contain a light-transmitting material in consideration of the following step (light irradiation step). The constituent material of the mold 104 is specifically suitably a light transparent resin, such as glass, quartz, PMMA, or poly-carbonate resin, a flexible film, such as a transparent metal vapor deposition film or polydimethyl siloxane, a photocured film, a metal film, or the like. However, when the light transparent resin is used as the constituent material of the mold 104, it is necessary to select a resin which does not dissolve in the components contained in the photocurable composition for imprint 101. Quartz is particularly suitable because the thermal expansion coefficient is low and pattern distortion is small.

The fine pattern on the surface of the mold 104 suitably has a pattern height of 4 nm or more and 200 nm or less and an aspect ratio of 1 or more and 10 or less.

In order to increase the releasability of the photocurable composition for imprint 101 and the surface of the mold 104, the mold 104 may be surface treated before this step which is the mold contact step of the photocurable composition for imprint and the mold. As the surface treatment method, a method including applying a mold release agent to the surface of the mold to form a mold release agent layer is mentioned. Herein, examples of the mold release agent to be applied to the surface of the mold include a silicone mold release agent, a fluorine mold release agent, a hydrocarbon mold release agent, a polyethylene mold release agent, a polypropylene mold release agent, a paraffin mold release agent, a montan mold release agent, a carnauba mold release agent, and the like. For example, a commercially-available coating type mold release agent, such as Optool DSX manufactured by Daikin Industries, LTD. can also be suitably used. The mold release agents may be used alone or in combination of two or more kinds thereof. Among the above, the fluorine mold release agent and the hydrocarbon mold release agent are particularly suitable.

In this step (mold contact step), when the mold 104 and the photocurable composition for imprint 101 are brought into contact with each other as illustrated in FIG. 1B(b-1), the pressure to be applied to the photocurable composition for imprint 101 is not particularly limited and is usually 0 MPa or more and 100 MPa or less. In particular, the pressure is suitably 0 MPa or more and 50 MPa or less, more suitably 0 MPa or more and 30 MPa or less, and still more suitably 0 MPa or more and 20 MPa or less.

The period of time while the mold 104 is brought into contact with the photocurable composition for imprint 101 in this step is not particularly limited and is usually 0.1 second or more and 600 seconds or less, suitably 0.1 second or more and 300 seconds or less, still more suitably 0A second or more and 180 seconds or less, and particularly suitably 0.1 second or more and 120 seconds or less.

This step can also be performed under any condition of under an air atmosphere, under reduced pressure atmosphere, and under an inactive gas atmosphere and the reduced pressure atmosphere or the inactive gas atmosphere is suitable because influence of oxygen or moisture on the curing reaction can be prevented. Specific examples of the inactive gas usable when performing this step under the inactive gas atmosphere include nitrogen, carbon dioxide, helium, argon, various kinds of fluorocarbon gas, and the like or a mixed gas thereof. When performing this step under a specific gas atmosphere including the air atmosphere, a suitable pressure is 0.0001 atm or more and 10 atm or less.

The mold contact step may be performed under an atmosphere containing condensable gas (hereinafter referred to as a condensable gas atmosphere). The condensable gas in this specification refers to gas which is condensed and liquefied by the capillary pressure generated when the gas in the atmosphere is filled into the concave portions of the fine pattern formed on the mold 104 and a gap between the mold and the substrate together with the coating film (partially) 106. The condensable gas is present in the form of gas in the atmosphere before the photocurable composition 101 (layer to which a shape is to be transferred) and the mold 104 are brought into contact with each other in the mold contact step (FIG. 1B(b-1)).

When the mold contact step is performed under the condensable gas atmosphere, air bubbles disappear due to the liquefaction of the gas filled into the concave portions of the fine pattern, and thus the filling properties are excellent. The condensable gas may dissolve in the photocurable composition 101.

The boiling point of the condensable gas is not particularly limited insofar as the boiling point is equal to or less than the atmospheric temperature of the mold contact step and is suitably −10° C. to 23° C. and more suitably 10° C. to 23° C. When the boiling point is in this range, the filling properties are more excellent.

The vapor pressure of the condensable gas at the atmospheric temperature in the mold contact step is not particularly limited insofar as the vapor pressure is equal to or less than the mold pressure when impressed in the mold contact step and is suitably 0.1 to 0.4 MPa. When the vapor pressure is in this range, the filling properties are more excellent. When the vapor pressure at the atmospheric temperature is larger than 0.4 MPa, there is a tendency that the effect that air bubbles disappear cannot be sufficiently obtained. On the other hand, when the vapor pressure at the atmospheric temperature is smaller than 0.1 MPa, the pressure needs to be reduced, so that there is a tendency for a device to be complicated.

The atmospheric temperature of the mold contact step is not particularly limited and is suitably 20° C. to 25° C.

Specific examples of the condensable gas include chlorofluocarbon, such as: chlorofluorocarbon (CFC), such as trichlorofluoro methane, hydrofluorocarbon (HFC), such as fluorocarbon (FC), hydrochlorofluorocarbon (HCFC), and 1,1,1,3,3-pentafluoro propane ($CHF_2CH_2CF_3$, HFC-245fa, PFP), and hydrofluoro ether (HFE), such as pentafluoroethyl methyl ether ($CF_3CF_2OCH_3$, HFE-245mc).

Among the above, from the viewpoint that the filling properties at an atmospheric temperature of 20° C. to 25° C. in the mold contact step are excellent, 1,1,1,3,3-pentafluoro propane (Vapor pressure at 23° C. of 0.14 MPa, Boiling point of 15° C.), trichlorofluoro methane (Vapor pressure at 23° C. of 0.1056 MPa, Boiling point of 24"C), and pentafluoroethyl methyl ether are suitable. From the viewpoint that the safety is excellent, 1,1,1,3,3-pentafluoro propane is particularly suitable.

The condensable gas may be used alone or as a mixture of two or more kinds thereof. The condensable gas may be mixed with non-condensable gas, such as air, nitrogen, carbon dioxide, helium, and argon for use. The non-condensable gas to be mixed with the condensable gas is suitably helium from the viewpoint of the filling properties. Helium can permeate the mold 104. Therefore, when the gas (condensable gas and helium) in the atmosphere is filled into the concave portions of the fine pattern formed on the mold 104 together with the coating film (partially) 106 in the mold contact step, the condensable gas is liquefied and also helium permeates the mold.

[Alignment Step [3]]

Figure 1C:
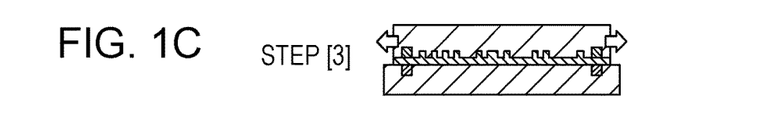
FIG. 1C is a schematic cross sectional view illustrating the example of a method for producing a film of this embodiment.

Next, as illustrated in FIG. 1C, the positions of the mold and/or the substrate to be processed are adjusted in such a manner that a mold side aligning mark 105 and an aligning mark 103 of the substrate to be processed are in agreement with each other.

[Light Irradiation Step [4]]

Figure 1D:
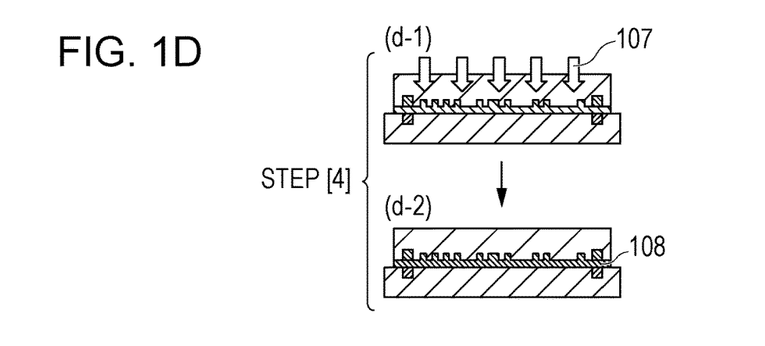
FIG. 1D includes FIGS. 1D(d-1) and 1D(d-2) illustrating schematic cross sectional views illustrating the example of a method for producing a film of this embodiment.

Next, a contact portion with the mold of the photocurable composition for imprint, in detail the coating film 106 filled into the fine pattern of the mold, is irradiated with light through the mold 104 in the state where the positions are aligned in the step [3] as illustrated in FIG. 1D (FIG. 1D(d-1)). Thus, the coating film 106 filled into the fine pattern of the mold 104 is cured by the emitted light to be a photocured film 108 (FIG. 1D(d-2)).

Herein, the light irradiating the photocurable composition for imprint 101 configuring the coating film 106 filled into the fine pattern of the mold is selected according to the sensitivity wavelength of the photocurable composition for imprint 101. Specifically, it is suitable to select ultraviolet light of a wavelength of 150 nm or more and 400 nm or less, X-rays, electron beams, or the like as appropriate for use.

Among the above, the light (irradiation light 107) irradiating the photocurable composition for imprint 101 is particularly suitably ultraviolet light. This is because those commercially available as a curing assistant (photopolymerization initiator) are compounds having sensitivity in ultraviolet light in many cases. Herein, examples of a light source emitting ultraviolet light include, for example, a high pressure mercury lamp, an ultrahigh pressure mercury lamp, a low pressure mercury lamp, a Deep-UV lamp, a carbon arc light, a chemical lamp, a metal halide lamp, a xenon lamp, a KIT excimer laser, an ArF excimer laser, an $F_2$ excimer laser, and the like and the ultrahigh pressure mercury lamp is particularly suitable. The number of the light sources to be used may be one or two or more. When performing the light irradiation, the light irradiation may be performed to the entire surface of the coating film 106 or only to a partial region thereof.

The light irradiation may be intermittently performed to the entire region on the substrate two or more times or may be continuously performed to the entire region. Or, a partial region A may be irradiated with light in a first irradiation step, and then a region B different from the region A may be irradiated with light in a second irradiation step.

[Mold Release Step [5]]

Figure 1E:
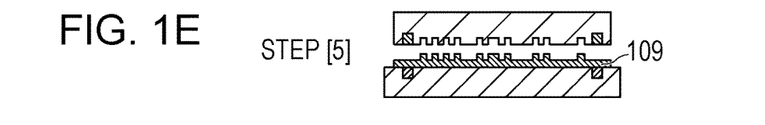
FIG. 1E is a schematic cross sectional view illustrating the example of a method for producing a film of this embodiment.

Next, the photocured film 108 and the mold 104 are released from each other. In this case, a photocured film 109 having a predetermined pattern shape is formed on the substrate 102.

In this step (mold release step), the photocured film 108 and the mold 104 are released from each other, and then the photocured film 109 having a pattern shape serving as a reversal pattern of the fine pattern formed on the mold 104 is obtained in the step [4] (light irradiation step) as illustrated in FIG. 1E.

By a series of steps (manufacturing step) having the step [1] to step [5] above, the photocured film having a desired irregular pattern shape (pattern shape following the irregular shape of the mold 104) at a desired position can be obtained. The obtained photocured film can also be utilized as optical members (including the case where the photocured film is used as one member of an optical member), such as a Fresnel lens and a diffraction grating, for example. In such a case, the photocured film can be used as an optical member at least having the substrate 102 and the photocured film 109 having a pattern shape arranged on the substrate 102.

According to the method for producing a film having a pattern shape of this embodiment, a repetition unit (shot) including the step [1] to the step [5] can be repeatedly performed two or more times on the same substrate to be processed. By repeating the repetition unit (shot) including the process [1] to the process [5] two or more times, a photocured film having a plurality of desired irregular pattern shapes (pattern shape following the irregular shape of the mold 104) at desired positions of the substrate to be processed can be obtained.

[Remaining Film Removal Step [6] of Removing a Part of Photocured Film]

Figure 1F:
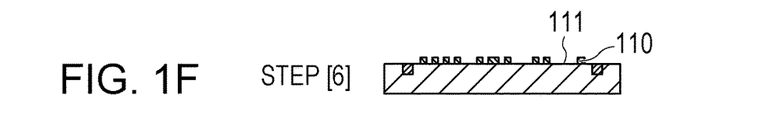
FIG. 1F is a schematic cross sectional view illustrating the example of a method for producing a film of this embodiment.

The photocured film obtained by the mold release process which is the process [5] has a specific pattern shape but the photocured films may partially remain also in regions other than the region where the pattern shape is formed (in the following description, such a part of the photocured film is sometimes referred to as a remaining film). In such a case, the obtained photocured film (remaining film) in the region to be removed of the photocured film having the pattern shape is removed, whereby a photocured film pattern 110 having a desired irregular pattern shape (pattern shape following the irregular shape of the mold 104) can be obtained as illustrated in FIG. 1F.

Herein, as a method for removing the remaining film, a method removing the photocured film (remaining film) serving as the concave portions of the photocured film 109 by a method, such as etching, for example, to expose the surface of the substrate 102 in the concave portions of the pattern of the photocured film 109 is mentioned.

When the photocured in the concave portions of the photocured film 109 is removed by etching, a specific method therefor is not particularly limited and knower methods, e.g., dry etching, can be used. For the dry etching, a known dry etching device can be used. A sauce gas in the dry etching is selected as appropriate according to the element composition of the photocured film which is to be etched and halogen gas, such as $CF_4$, $C_2F_6$, $C_3F_8$, $CCl_2F_2$, $CCl_4$, $CBrF_3$, $BCl_3$, $PCl_3$, $BCl_3$, $SF_6$, and $Cl_2$, gas containing oxygen atoms, such as $O_2$, CO, and $CO_2$, inactive gas, such as He, $N_2$, and Ar, and gas, such as $H_2$ and $NH_3$, and the like can be used. The gas can also be mixed for use.

By the manufacturing step including the step [1] to the step [6] above, the photocured film pattern 110 having a desired irregular pattern shape (pattern shape following the irregular shape of the mold 104) at desired positions can be obtained and articles having the photocured film pattern can be obtained. When the substrate 102 is processed using the obtained photocured film pattern 110, a substrate processing step (Step [7]) described later is performed.

On the other hand, the obtained photocured film pattern 110 can be utilized as optical members (including the case where the photocured film pattern 110 is used as one member of an optical member), such as a diffraction grating and a polarizing plate, and then an optical component can also be obtained. In such a case, an optical component at least having the substrate 102 and the photocured film pattern 110 arranged on the substrate 102 can be obtained.

[Substrate Processing Step [7]]

The photocured film pattern 110 having an irregular pattern shape which is obtained by the method for producing a photocured film having a pattern shape of this embodiment can also be used as, for example, a film for interlayer insulation film contained in electronic components typified by semiconductor devices, such as LSI, System LSI, DRAM, SDRAM, RDRAM, and D-RDRAM, and can also be used as a resist film in manufacturing semiconductor devices.

When the photocured film pattern 110 is utilized as a resist film, etching or ion implantation is performed to a part of the substrate exposed in the etching step which is Step [6] (region denoted by the reference numeral 111 in FIG. 1F). In this case, the photocured film pattern 110 functions as an etching mask. In addition thereto, by configuring electronic components, a circuit structure 112 (FIG. 1G) based on the pattern shape of the photocured film pattern 110 can be formed on the substrate 102. Thus, a circuit board to be utilized in semiconductor devices and the like can be manufactured, By connecting the circuit board and a circuit control mechanism of the circuit board, electronic devices, such as displays, cameras, and medical devices, can also be configured.

Figure 1G:
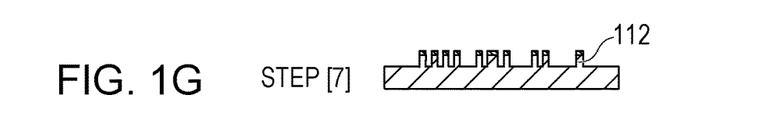
FIG. 1G is a schematic cross sectional view illustrating the example of a method for producing a film of this embodiment.

Similarly, optical components can also be obtained by performing etching or ion implantation utilizing the photocured film pattern 110 as a resist film.

When producing substrates with a circuit and electronic components, the photocured film pattern 110 may be finally removed from the processed substrate but a configuration in which the photocured film pattern 110 may be left as a member configuring an element may be acceptable.

OTHER EMBODIMENTS

The photocured film formed by the method is suitable for the use in which the photocured film is processed by a dry etching step. More specifically, the photocured film is useful as a photocured film for dry etching to be used for a dry etching process which is obtained by curing the photocurable composition for imprint on a substrate.

By passing through the steps described above, a semiconductor substrate pretreated by dry etching having a semiconductor substrate and the photocured film for dry etching patterned on the semiconductor substrate can be provided.

EXAMPLES

Hereinafter, the present invention is described in detail with reference to Examples but the technical scope of the present invention is not limited to Examples described below. "Part(s)" used in the following description is a unit based on weight (part by weight) unless otherwise particularly specified.

Reagents (polymerizable compounds, polymerization initiators) used in any one of Examples and Comparative Examples and contained in photocurable compositions for imprint are mentioned below.

(A) Polymerizable Compound

<A1> isobornyl acrylate (manufactured by Kyoeisha Chemical Co., Ltd., Trade name: IB-XA)

<A2> Benzyl acrylate (manufactured by Osaka Organic Chemical Industry Co., Ltd., Trade name: V #160)

<A3> Dicyclopentanyl acrylate (manufactured by Hitachi Chemical Co., Ltd., Trade name: FA-513AS)

<A4> 2-naphthyl methyl acrylate (manufactured by NARD institute, Ltd.)

<A5> Diphenyl methanol acrylate (manufactured by NARD institute, Ltd.)

<A6> 1,6-hexanediol diacrylate (manufactured by Osaka Organic Chemical industry Co., Ltd., Trade name: V #230)

<A7> 1,10-decanediol diacrylate (manufactured by Osaka Organic Chemical Industry Co., Ltd., Trade name: V #230)

<A8> Dimethylol tricyclodecane diacrylate (manufactured by Kyoeisha Chemical Co., Ltd., Trade name: DCP-A)

<A9> Phenylethylene glycol diacrylate (manufactured by NARD institute, Ltd.)

<A10> m-xylylene diacrylate (manufactured by NARD institute, Ltd.)

<A11> 2-phenyl-1,3-propane diol diacrylate (manufactured by NARD institute, Ltd.)

(B) Polymerization Initiator

<B1> Lucirin TPO (manufactured by BASF Japan)

The compositions of photocurable compositions for imprint produced using the materials mentioned above are shown in Table 1 shown below. After the preparation, filtration with a 0.2 μm filter containing ultrahigh molecular weight polyethylene was performed.

For the photocurable compositions for imprint shown in Table 1 above, the measurement of viscosity, glass transition temperature, and dry etching was performed using the following procedure, and then the coefficient of thermal expansion, the Ohnishi parameter, and the etching rate were calculated.

(1. Measurement of Viscosity of Photocurable Composition for Imprint)

The viscosity of the photocurable compositions for imprint at 23° C. was measured using a cone-plate type rotation viscometer RE-85L (manufactured by Toki Sangyo Co., Ltd.).

(2. Production of Photocured Film for Measurement of Glass Transition Temperature of Photocurable Composition for Imprint)

70 μl of a resist was added dropwise and filled into a 100 μm gap between a rotating rod having a bottom surface with a diameter Φ of 8.0 mm and a quartz stage using a rheometer MCR301 with a UV irradiation option manufactured by Anton Paar. The normal reaction of the rotating rod was set to zero N in such a manner that the gap followed curing and shrinkage of the photocurable composition.

Next, the rotational vibration cycle of the rotating rod was set to 5 Hz, and 10 seconds after starting the rotation vibration, UV light irradiation was started from the quartz stage side. The exposure time was set to 600 seconds, the exposure wavelength was fixed to 365 nm, the illuminance was fixed to 1.0 mW/cm$^2$, and the temperature was fixed to 23° C.

TABLE 1

| | Polymerizable compound [part by weight] | | | | | | | | | | | Polymerization initiator [part by weight] |
|---|---|---|---|---|---|---|---|---|---|---|---|---|
| | A1 | A2 | A3 | A4 | A5 | A6 | A7 | A8 | A9 | A10 | A11 | B1 |
| Example 1 | 60 | — | — | — | — | — | — | — | — | 40 | — | 3 |
| Example 2 | 50 | — | — | — | — | — | — | — | — | 50 | — | 3 |
| Example 3 | 75 | — | — | — | — | — | — | — | — | 25 | — | 3 |
| Example 4 | — | — | 60 | — | — | — | — | — | — | 40 | — | 3 |
| Example 5 | — | — | 50 | — | — | — | — | — | — | 50 | — | 3 |
| Example 6 | — | — | — | 60 | — | — | — | — | — | 40 | — | 3 |
| Example 7 | — | — | — | — | 75 | 25 | — | — | — | — | — | 3 |
| Example 8 | — | — | — | — | — | — | — | — | 100 | — | — | 3 |
| Example 9 | — | 50 | — | — | — | — | — | — | — | — | 50 | 3 |
| Example 10 | — | — | — | — | — | — | — | — | — | — | 100 | 3 |
| Comparative Example 1 | 100 | — | — | — | — | — | — | — | — | — | — | 3 |
| Comparative Example 2 | — | — | 100 | — | — | — | — | — | — | — | — | 3 |
| Comparative Example 3 | — | — | — | 100 | — | — | — | — | — | — | — | 3 |
| Comparative Example 4 | — | — | — | — | 100 | — | — | — | — | — | — | 3 |
| Comparative Example 5 | — | 75 | — | — | — | — | 25 | — | — | — | — | 3 |
| Comparative Example 6 | — | 60 | — | — | — | — | — | 40 | — | — | — | 3 |
| Comparative Example 7 | — | 50 | — | — | 50 | — | — | — | — | — | — | 3 |
| Comparative Example 8 | — | 50 | — | — | — | 50 | — | — | — | — | — | 3 |

(3. Measurement of Glass Transition Temperature and Coefficient of Thermal Expansion of Photocurable Composition for Imprint)

In the state where the normal reaction of the rotating rod was set to zero N in such a manner that the gap between the rotating rod and the quartz stage followed thermal expansion and thermal shrinkage of the photocurable composition, the photocured film produced in (2) was measured for the loss tangent tam) while increasing the temperature from 23° C. to 200° C. The temperature increase rate was set to 4° C./min. The temperature at which the tan δ reached the maximum was defined as the glass transition temperature. Further, the coefficient of thermal expansion of the photocured film was calculated by the following expression (3).

Film thickness (μm) of photocured film at 120° C./Film thickness (μm) of photocured film at 23° C.=Coefficient of thermal expansion (%)   (3)

Herein, the film thickness of the photocured film is a gap between the rotating rod and the quartz stage.

(4. Calculation of Ohnishi Parameter of Photocurable Composition for Imprint)

The Ohnishi parameter of the (A) component of the photocurable compositions shown in the composition table shown in Table 1 was calculated using the following expression (2).

$$OP = n_1 OP_1 + n_2 OP_2 + \ldots + n_n OP_n \quad (2)$$

(5. Production of Photocured Film for Dry Etching of Photocurable Composition for Imprint)

2 μL of the prepared photocurable composition for imprint was added dropwise onto a silicon wafer on which a 60 nm thick adhesion promotion layer was formed as an adhesion layer, a 1 mm thick quartz glass was covered from the top, and then a region (25 mm×25 mm) was filled with the photocurable composition for imprint.

Next, light emitted from a UV light source having an ultrahigh pressure mercury lamp from the top of the quartz glass was made to pass through an interference filter described later, and then emitted to a coating film for 200 seconds through the quartz glass. The interference filter used in the light irradiation was VPF-25C-1.0-15-31300 (manufactured by SIGMAKOKI Co., LTD.). The wavelength of the ultraviolet light which was the irradiation light was a single wavelength light of 313±5 nm and the illuminance was set to 1 mW/cm².

After the light irradiation, the quartz glass was peeled, and then a photocured film of the photocurable composition for imprint having an average film thickness of 3.2 μm was obtained on the silicon wafer.

(6. Measurement of Etching Rate of Photocured Film for Dry Etching of Photocurable Composition for Imprint)

Dry etching was performed for 500 seconds to the photocured film produced in (5) using a high density plasma etching device NE-550 manufactured by ULVAC and setting etching gas and the flow rate thereof to $CF_4/CHF_3=50$ sccm/50 sccm, and then the film thickness reduced by the dry etching was measured to calculate the dry etching rate (nm/s). A lower etching rate indicates that the dry etching resistance is higher.

The measurement, results above are shown in Table 2 shown below. The dry etching rate ratio (DE rate ratio) was obtained by calculating the relative value, when the composition of Comparative Example 1 was set to 1, in terms of percentage.

TABLE 2

| | Multifunctional monomer ratio [part by weight] | Glass transition temperature (° C.) | Coefficient of thermal expansion [%] | OP | DE rate ratio [%] | Viscosity [mP*s] |
|---|---|---|---|---|---|---|
| Example 1 | 40 | 154 | 1 | 3.19 | 81 | 9.2 |
| Example 2 | 50 | 168 | 3 | 3.19 | 81 | 9.7 |
| Example 3 | 25 | 141 | 6 | 3.19 | 85 | 8.5 |
| Example 4 | 40 | 131 | 3 | 3.07 | 78 | 11.4 |
| Example5 | 50 | 143 | 7 | 3.09 | 78 | 11.7 |
| Example 6 | 40 | 95 | 6 | 2.65 | 72 | 10.7 |
| Example 7 | 25 | 92 | 8 | 2.80 | 82 | 15.7 |
| Example 8 | 100 | >200 | 6 | 3.20 | 100 | 23.0 |
| Example 9 | 100 | >101 | — | 2.92 | 85 | 6.1 |
| Example 10 | 100 | >200 | — | 3.18 | 90 | 36.6 |
| Comparative Example 1 | 0 | 132 | 18 | 3.18 | 100 | 7.5 |
| Comparative Example 2 | 0 | 109 | 13 | 3.00 | 81 | 10.6 |
| Comparative Example 3 | 0 | 95 | 10 | 2.33 | 73 | 9.6 |
| Comparative Example 4 | 0 | 86 | 10 | 2.29 | 83 | 22.1 |
| Comparative Example 5 | 25 | 55 | 13 | 2.83 | 96 | 4.2 |
| Comparative Example 6 | 40 | 75 | 15 | 2.89 | 91 | 6.6 |
| Comparative Example 7 | 50 | 65 | 19 | 3.38 | 105 | 3.4 |
| Comparative Example 8 | 50 | 45 | 22 | 3.15 | 101 | 3.8 |

It can be confirmed from the results shown in Table 2 that the photocurable compositions for imprint of Examples have a small thermal expansion.

Considering the fact that the coefficient of thermal expansion is less than 10% in Examples 1 to 8, Examples 1 to 8 are compositions in which the thermal expansion of the resist in the dry etching was small. Furthermore, considering the fact that the DE rate ratio is equal to or higher than that of Comparative Example 1, Examples 1 to 8 are compositions having excellent dry etching resistance. Since the viscosity is also 50 mPa*s or less, the filling properties are also excellent. Considering the fact that Examples 9 and 10 have a DE rate ratio smaller than that of Comparative Example 1 and having a viscosity of 50 mPa*s or less, it is considered that Examples 9 and 10 are compositions having a small thermal expansion similarly to Examples 1 to 8.

On the other hand, in Comparative Examples 1 to 3, the glass transition temperature is 90° C. or more but the coefficient of thermal expansion is 10% or more. This is considered to be because the proportion of the multifunctional monomer is less than 20% by weight, i.e., only the monofunctional acrylic monomer is contained, and therefore the crosslink density of Comparative Examples 1 to 3 is lower than that of the compositions containing 20% by weight or more of the multifunctional acrylic monomer as in Examples 1 to 8. More specifically, it is considered that thermal distortion and thermal expansion are likely to occur in dry etching.

Comparative Examples 5 to 8 are compositions containing 20% by weight or more of the multifunctional monomer but the coefficient of thermal expansion is 10% or more. This is considered to be because the glass transition temperature is low, and therefore thermal distortion and thermal expansion are likely to occur in dry etching similarly to Comparative Examples 1 to 4.

It can be confirmed that, due to the fact that the multifunctional monomer is not contained, the composition of Examples 1 to 8 are photocurable compositions for imprint having small thermal expansion, excellent dry etching resistance, and also excellent filling properties.

INDUSTRIAL APPLICABILITY

As described above, the present invention can provide a photocurable composition for imprint having small thermal expansion in dry etching and excellent filling properties in an optical imprint method. Moreover, the present invention can also provide a method for producing the photocurable composition for imprint, a method for producing a film, a method for producing an optical component, a method for producing a circuit board, and a method for producing an electronic component.

The present invention can provide a photocurable composition for imprint having small thermal expansion in dry etching and excellent filling properties in an optical imprint method. Moreover, the present invention can also provide a method for producing a film using the photocurable composition for imprint, a method for producing an optical component using the photocurable composition for imprint, a method for producing a circuit board using the photocurable composition for imprint, and a method for producing an electronic component using the photocurable composition for imprint.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A photocurable composition for imprint at least comprising:
    a polymerizable compound (A); and
    a photopolymerization initiator (B),
    wherein the polymerizable compound (A) is a mixture of a monofunctional(meth)acrylic monomer and a multifunctional (meth)acrylic monomer, the polymerizable compound (A) contains 50% by weight or more and 75% by weight or less of the monofunctional (meth)acrylic monomer and 25% by weight or more and 50% by weight or less of the multifunctional (meth)acrylic monomer,
    wherein the monofunctional(meth)acrylic monomer and the multifunctional (meth)acrylic monomer of the mixture are selected such that a glass transition temperature of a photocured substance of the photocurable composition is 90° C. or more, and a viscosity is 5 mPa*s or more and 12 mPa*s or less,
    wherein the multifunctional acrylic monomer contained in the polymerizable compound (A) is any one of phenyl ethylene glycol diacrylate, and 2-phenyl-1,3-propanediol diacrylate,
    wherein the monofunctional(meth)acrylic monomer contained in the polymerizable compound (A) is any one of isobornyl acrylate, benzyl acrylate, dicyclopentanyl acrylate, 2-naphthyl methyl acrylate, and diphenyl methanol acrylate.

2. The photocurable composition for imprint according to claim 1, wherein the photocurable composition for imprint having a glass transition temperature of 90° C. or more is specified by measuring a loss tangent tan δ of a film obtained by photocuring a photocurable composition containing 100 parts by weight of the polymerizable compound (A) and 3 parts by weight of 2,4,6-trimethyl benzoyl diphenyl phosphine oxide as the photopolymerization initiator (B) while increasing a temperature to find out that a temperature at which the tan δ reaches a maximum is 90° C. or more.

3. The photocurable composition for imprint according to claim 1, wherein an Ohnishi parameter of the polymerizable compound (A) is 3.2 or less.

4. A method for producing a film having a pattern shape comprising:
    a step (1) of arranging the photocurable composition for imprint according to claim 1 on a substrate;
    a step (2) of bringing the curable composition into contact with a mold having an original pattern for transferring a pattern shape;
    a step (3) of aligning the substrate and the mold;
    a step (4) of irradiating the curable composition with light to form a photocured film; and
    a step (5) of releasing the cured film and the mold from each other.

5. The method for producing a film having a pattern shape according to claim 4, comprising performing the steps (1) to (5) two or more times to different regions on the substrate.

6. The method for producing a film having a pattern shape according to claim 4, wherein a surface of the original pattern of the mold contains quartz.

7. A method for manufacturing an optical component, comprising:
    a step of obtaining a film having a pattern shape by the manufacturing method according to claim 4.

8. The method for producing a film having a pattern shape according to claim 4, wherein the step (2) is performed under an atmosphere containing condensable gas.

9. The method for producing a film having a pattern shape according to claim 8, wherein the step (2) is performed under an atmosphere of a mixed gas of the condensable gas and non-condensable gas.

10. The method for producing a film having a pattern shape according to claim 9, wherein the non-condensable gas is helium.

11. The method for producing a film having a pattern shape according to claim 8, wherein the condensable gas is 1,1,1,3,3-pentafluoro propane.

12. A method for producing an optical component, comprising:
a step of obtaining a film having a pattern shape by the manufacturing method according to claim 4; and a step of performing etching or ion implantation to a substrate using the pattern shape of the obtained film as a mask.

13. A method for producing a circuit board, comprising:
a step of obtaining a film having a pattern shape by the manufacturing method according to claim 4; and
a step of performing etching or ion implantation to a substrate using the pattern shape of the obtained film as a mask.

14. A method for producing an electronic component, comprising:
a step of obtaining a circuit board by the method for producing a circuit board according to claim 13; and
a step of forming an electronic component on the circuit board.

15. A photocured film for dry etching, which is used for dry etching, the photocured film being obtained by curing the photocurable composition for imprint according to claim 1.

16. A semiconductor substrate pretreated by dry etching, comprising
a semiconductor substrate; and
the photocured film for etching according to claim 15 patterned onto the semiconductor substrate.

17. The photocurable composition for imprint according to claim 1, wherein the monofunctional(meth)acrylic monomer and the multifunctional (meth)acrylic monomer of the mixture are selected such that a coefficient of thermal expansion of the photocured substance of the photocurable composition is less than 10%.

18. The composition according to claim 1, wherein
the multifunctional acrylic monomer contained in the polymerizable compound (A) is any one of phenyl ethylene glycol diacrylate, and 2-phenyl-1,3-propanediol diacrylate, and
the monofunctional(meth)acrylic monomer contained in the polymerizable compound (A) is any one of isobornyl acrylate, benzyl acrylate, dicyclopentanyl acrylate, and diphenyl methanol acrylate.

* * * * *